United States Patent
Shiu et al.

(10) Patent No.: US 7,262,494 B2
(45) Date of Patent: Aug. 28, 2007

(54) THREE-DIMENSIONAL PACKAGE

(75) Inventors: Hei Ming Shiu, Hong Kong (HK); On Lok Chau, Hong Kong (HK); Fei Ying Wong, Hong Kong (HK)

(73) Assignee: Freescale Semiconductor, Inc., Austin, TX (US)

( * ) Notice: Subject to any disclaimer, the term of this patent is extended or adjusted under 35 U.S.C. 154(b) by 210 days.

(21) Appl. No.: 11/082,096

(22) Filed: Mar. 16, 2005

(65) Prior Publication Data

US 2006/0208363 A1 Sep. 21, 2006

(51) Int. Cl.
*H01L 23/02* (2006.01)
*H01L 23/495* (2006.01)

(52) U.S. Cl. .................. 257/686; 257/666; 257/685; 257/777

(58) Field of Classification Search ........... 257/666, 257/676, 685–687, 777, 778, 787
See application file for complete search history.

(56) References Cited

U.S. PATENT DOCUMENTS

| | | | |
|---|---|---|---|
| 5,608,265 A | * | 3/1997 | Kitano et al. .......... 257/738 |
| 5,744,827 A | * | 4/1998 | Jeong et al. .......... 257/686 |
| 6,294,406 B1 | | 9/2001 | Bertin et al. |
| 6,320,251 B1 | | 11/2001 | Glenn |
| 6,545,345 B1 | | 4/2003 | Glenn et al. |
| 6,605,866 B1 | | 8/2003 | Crowley et al. |
| 6,750,545 B1 | | 6/2004 | Lee et al. |
| 2003/0201520 A1 | | 10/2003 | Knapp et al. |

* cited by examiner

Primary Examiner—Hung Vu
(74) Attorney, Agent, or Firm—Charles Bergere

(57) ABSTRACT

An electronic device (60) including a first integrated circuit (IC) die (62) electrically connected to a first lead frame (64) and a second IC die (66) electrically connected to a second lead frame (68). The first lead frame (64) is electrically connected to the second lead frame (68) by at least one stud bump (72), which is selectively formed where an electrical connection between the first lead frame (64) and the second lead frame (68) is required. The first and second lead frames (64) and (68), the first and second IC dies (62) and (66), and the at least one stud bump (72) are encapsulated by a mold compound (74) to form a 3D package.

7 Claims, 5 Drawing Sheets

THREE-DIMENSIONAL PACKAGE

BACKGROUND OF THE INVENTION

The present invention relates to the packaging of semiconductor devices in general and more specifically to a three-dimensional (3D) package and a method of forming the 3D package.

The number of transistors per square inch on integrated circuits (ICs) has been doubling approximately every eighteen (18) months in accordance with Moore's Law, making it possible to provide greater functionality with the same quantity of real estate. However, because the wiring capacity of printed circuit boards (PCBs) has not increased at a corresponding rate, system-level interconnect density is threatening to limit the added functionality attainable with the advances in IC technology.

To this end, 3D packaging has been developed to bridge the density differences between ICs and PCBs. 3D packaging involves either stacking two or more dies within a single package, or stacking and connecting completed packages. 3D packages offer significant size reductions compared to existing packages as they pack more silicon functions per square centimeter of board space and per cubic centimeter of application space. In light of these and numerous other advantages, 3D packages are capturing an increasing share of the market for IC packages. Thus, it would be desirable to have an inexpensive method of forming 3D packages having improved characteristics.

Accordingly, it is an object of the present invention to provide a 3D package having improved characteristics and an inexpensive method of fabricating such a package.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements.

DETAILED DESCRIPTION OF THE PREFERRED EMBODIMENTS

Figure 1:
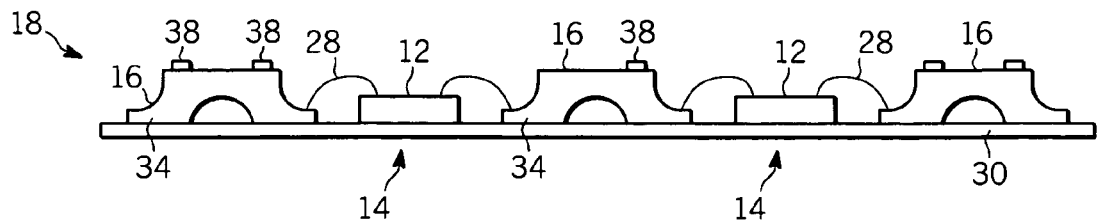
FIGS. 1-4 are enlarged cross-sectional views illustrating a method of forming a plurality of stacked die assemblies in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

To achieve the objects and advantages discussed above and others, the present invention provides three dimensional packaged device including a first integrated circuit (IC) die electrically connected to a first lead frame and a second IC die electrically connected to a second lead frame. The first lead frame is stacked on and electrically connected to the second lead frame via at least one stud bump. The at least one stud bump is selectively formed where an electrical connection between the first lead frame and the second lead frame is required. The first and second lead frames, the first and second IC dies, and the at least one stud bump are encapsulated by a mold compound to form a stackable 3D packaged device.

The present invention also provides a method of forming a 3D packaged device. The method includes the steps of electrically connecting a first IC die to a first lead frame, and a second IC die to a second lead frame. At least one stud bump is selectively formed on the first lead frame where an electrical connection between the first lead frame and the second lead frame is required. The first lead frame is electrically connected to the second lead frame via the at least one stud bump. Then, the first and second lead frames, the first and second IC dies, and the at least one stud bump are encapsulated to form a stackable, 3D packaged device.

The present invention further provides a method of forming a plurality of 3D packages including the steps of electrically connecting a first plurality of semiconductor IC dies to respective die receiving areas of first lead frames of a first lead frame panel, and a second plurality of semiconductor IC dies to respective die receiving areas of second lead frames of a second lead frame panel. A plurality of stud bumps is formed on the first lead frames of the first lead frame panel, each stud bump being selectively formed where an electrical connection between respective ones of the first lead frames and the second lead frames is required. The second lead frame panel is stacked on the first lead frame panel. The first and second lead frame panels may be aligned with a pilot pin. The first and second pluralities of lead frames are connected to respective ones of each other by way of the stud bumps. A molding operation is performed to encapsulate the first and second pluralities of IC dies, the electrical connections, and the stud bumps. Thereafter, a singulating operation is performed to separate adjacent ones of the stacked first and second IC dies, thereby forming a plurality of stacked die assemblies.

FIGS. 1-4 illustrate a method of forming a plurality of stacked die assemblies 10 in accordance with an embodiment of the present invention.

Figure 2:
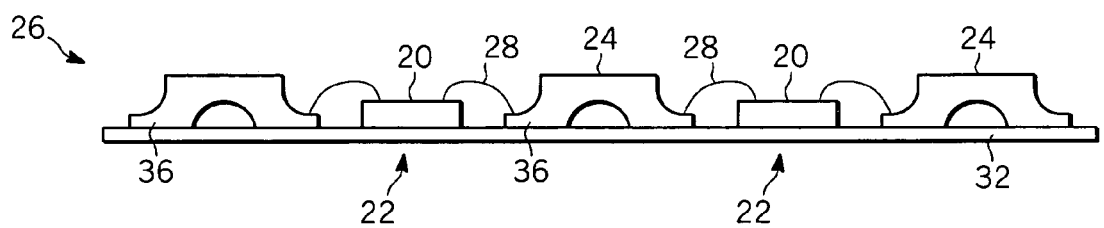

FIG. 1 shows a first plurality of semiconductor integrated circuit (IC) dies 12 attached to respective die receiving areas 14 of first lead frames 16 of a first lead frame panel 18, while FIG. 2 shows a second plurality of semiconductor IC dies 20 attached to respective die receiving areas 22 of second lead frames 24 of a second lead frame panel 26.

The IC dies 12 and 20 may be processors, such as digital signal processors (DSPs), special function circuits, such as memory address generators, or circuits that perform any other type of function. The IC dies 12 and 20 are not limited to a particular technology such as CMOS, or derived from any particular wafer technology. Further, the present invention can accommodate various die sizes, as will be understood by those of skill in the art. A typical example is a microprocessor or memory chip having a size of about 10 mm by 10 mm. Although FIGS. 1 and 2 show only two (2) dies each, it will be understood that more or fewer dies may be attached to the first and second lead frame panels 18 and 26, depending on the size of the first and second lead frame panels 18 and 26, the size of the IC dies 12 and 20, and the required functionality of the resulting stacked die assemblies 10. In this particular example, the IC dies 12 and 20 are electrically connected to leads of the lead frames 16 and 24 via a plurality of wire bonded wires 28. Nevertheless, it should be understood that the present invention is not limited to wire bond type connections. In alternative embodiments, the IC dies 12 and 20 may, for example, be electrically connected to the leads of the respective lead frames 16 and 24 via flip chip bumps (see FIGS. 9 and 10).

As can be seen from FIGS. 1 and 2, each of the first and second lead frame panels 18 and 26 includes respective tapes 30 and 32 that adhere to respective first sides 34 and 36 of the first and second pluralities of lead frames 16 and 24. In this particular example, the first and second pluralities of lead frames 16 and 24 are etched copper lead frames, while the tapes 30 and 32 are mold masking tapes. The lead frame panels 18 and 26 may comprise arrays of lead frames, such as 3×6 arrays, as are known in the art and generally commercially available. However, it should be understood that the present invention is not limited to a particular type of lead frame or tape, or by the material from which the lead frames are made. For example, the first and second pluralities of lead frames 16 and 24 may be formed by etching or stamping.

Figure 9:
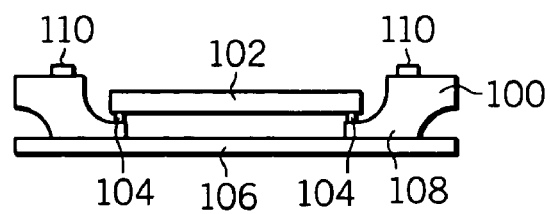
FIG. 9 is an enlarged cross-sectional view of an IC die electrically connected to a lead frame in accordance with another embodiment of the present invention.
Figure 10:
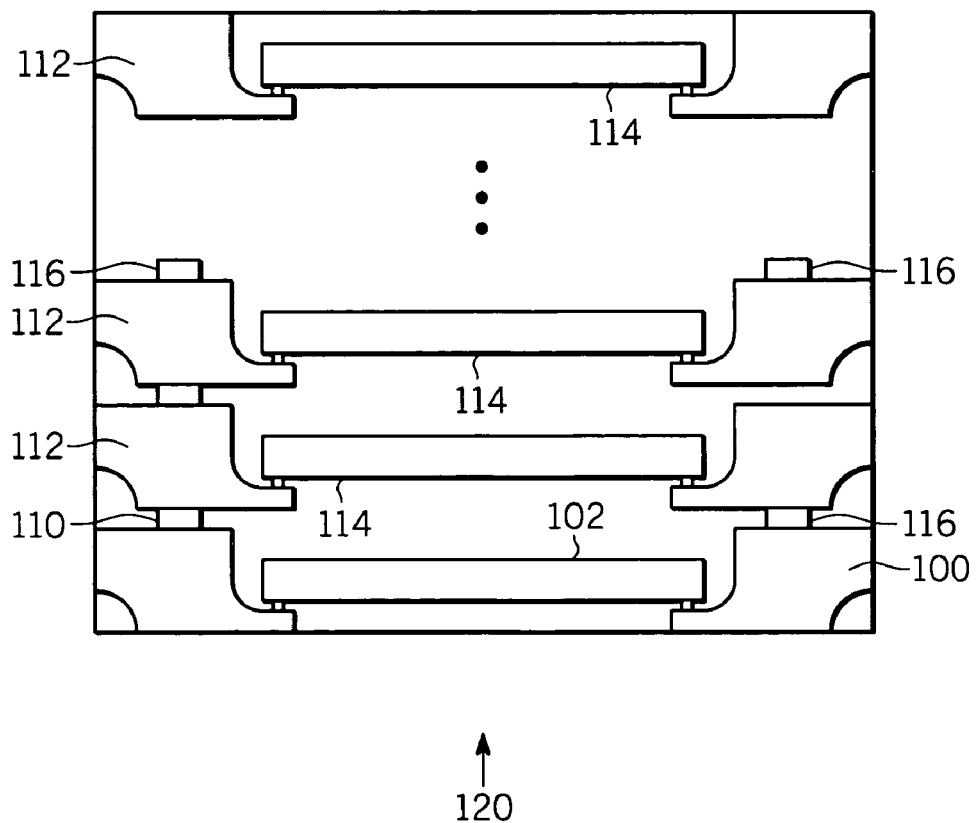
FIG. 10 is an enlarged cross-sectional view of a 3D stackable package in accordance with another embodiment of the present invention.

The thickness of the first and second lead frames 16 and 24 is related to the respective thickness of the first and second IC dies 12 and 20 and the thickness of the final packages. Specifically, in the embodiment shown in FIGS. 1-4, the first and second lead frames 16 and 24 have a thickness that is greater than a thickness of the respective IC dies 12 and 20 by a bit more than the height of the loops made by the wire bonds 28. If the first and second pluralities of IC dies 12 and 20 are coupled to the respective first and second pluralities of lead frames 16 and 24 via flip chip bumps (see flip chip bumps 104 in FIG. 9, described below), then the first and second lead frames 16 and 24 should have a thickness that is equal to at least the thickness of the respective first and second of IC dies 12 and 20 plus the height of the flip chip bumps, plus the height of the base of the first and second lead frames 16 and 24 on which the flip chip bumps rest. Although FIGS. 9 and 10 show the lead frames extending beyond the tops of the IC dies, the lead frames could be co-planar with the tops of the IC dies. Although the first and second lead frames 16 and 24 illustrated in FIGS. 1-4 are of substantially identical dimensions, it should be understood that the first and second pluralities of lead frames 16 and 24 may be of differing dimensions depending on the thickness of the respective first and second plurality of IC dies 12 and 20.

Referring now to FIG. 1, a plurality of stud bumps 38 is formed on the first lead frames 16 of the first lead frame panel 18 as shown. The stud bumps 38 are formed of an electrically conductive material such as, for example, gold, and may be formed using a wire binder. Each stud bump 38 is selectively formed where an electrical connection between the first lead frames 16 and the second lead frames 24 is required. By selectively forming the stud bumps 38, the electrical connection between portions of the first and second pluralities of IC dies 12 and 20 can be selectively defined, thereby providing great versatility in the design of the stacked die assembly 10. Accordingly, in the absence of a stud bump 38, there is no electrical connection between respective portions of the first IC die 12 and the second IC die 20. For example, the center lead frame 16 only has one stud bump 38 shown thereon.

In one embodiment, the stud bumps 38 are formed by the wire bonding machine in the same pass as the electrical connections between the first IC dies 12 and the first lead frames 16. By so doing, an additional process step for the formation of stud bumps is eliminated, thereby reducing the manufacturing cost of the final product.

Figure 3:
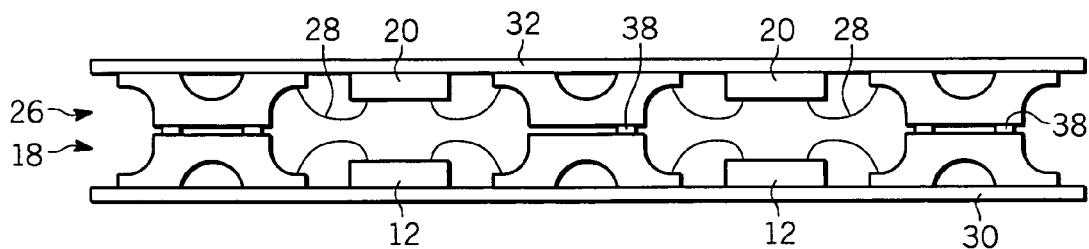

FIG. 3 shows the second lead frame panel 26 stacked on the first lead frame panel 18. The second lead frame panel 26 is flipped prior to stacking such that the tops of the second plurality of IC dies 20, from which the wire bonds 28 extend, are facing the tops of the first plurality of IC dies 12. The first and second lead frame panels 18 and 26 are aligned with one or more pilot pins. As can be seen, the first and second pluralities of lead frames 16 and 24 are connected to respective ones of each other by way of the stud bumps 38. Although the lead frame panels 18 and 26 in this particular example are stacked with the respective first and second pluralities of IC dies 12 and 20 facing one other, it will be understood that the present invention is not limited to such an arrangement. In alternative embodiments, the lead frame panels may be stacked such that all the IC dies face the same direction (see FIG. 10), or combinations of both directions.

Figure 4:
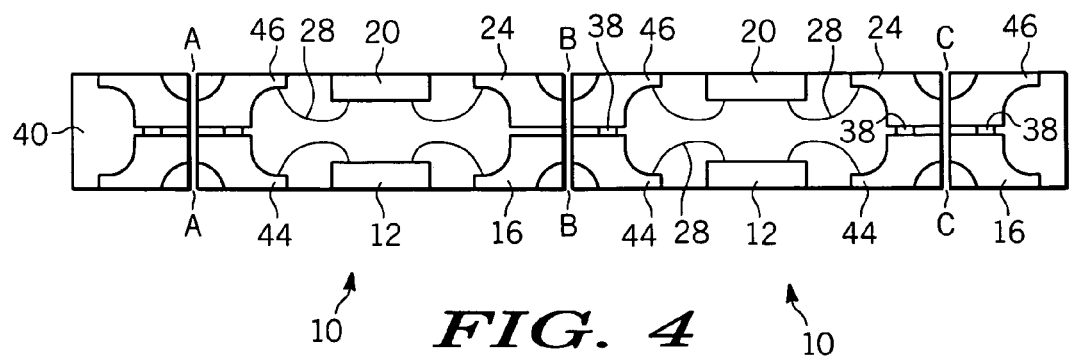

Referring now to FIG. 4, the first and second pluralities of IC dies 12 and 20, the electrical connections, and the stud bumps 38 are encapsulated with an encapsulant material 40. The encapsulant material 40 may comprise well known commercially available moulding materials such as plastic or epoxy.

Figure 5:
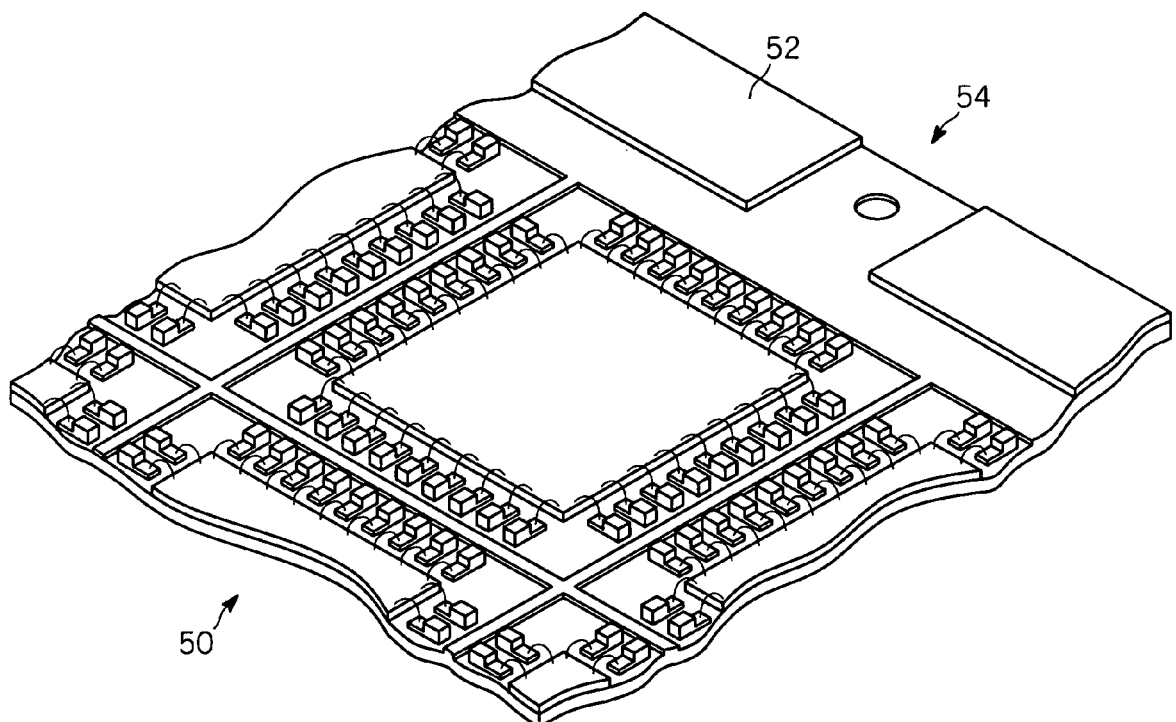
FIG. 5 is an enlarged perspective view of an edge of a lead frame panel in accordance with an embodiment of the present invention.

A molding operation such as, for example, an injection molding process is performed to encapsulate the first and second pluralities of IC dies 12 and 20, the electrical connections, and the stud bumps 38. A lead frame panel 50 suitable for the performance of such a molding operation is illustrated in FIG. 5. FIG. 5 is an enlarged perspective view of an edge 52 of the lead frame panel 50 in accordance with an embodiment of the present invention. As can be seen, the edge 52 of the lead frame panel 50 includes a half-etched portion 54. The half-etched portion 54 of the lead frame panel 50 forms a channel for the injection and flow of the encapsulant material 40 between the stacked lead frame panels 18 and 26. Existing technology for the etching of lead frames can be used to manufacture the lead frame panel 50 having the half-etched edge 52.

Referring again to FIG. 4, each of the stud bumps 38 is deformed by mold pressure such that a joint is formed between the respective first and second lead frames 16 and 24 during the molding operation. As can be seen, the tapes 30 and 32 are removed from the first and second pluralities of lead frames 16 and 24 such that terminals 44 and 46 on the respective first sides 34 and 36 of the first and second pluralities of lead frames 16 and 24 are exposed. In this particular example where the first and second pluralities of IC dies 12 and 20 are electrically connected to the first and second pluralities of lead frames 16 and 24 via wire bonds 28, detaping of the first and second lead frames 16 and 24 also exposes a surface of each of the first and second pluralities of IC dies 12 and 20.

Adjacent ones of the stacked first and second IC dies 12 and 20 are separated along the vertical lines A-A, B-B and C-C via a singulating operation such as, for example, a dicing saw method to form the plurality of stacked die assemblies 10. The singulating step is preferably performed before detaping. However, the singulating step could also be performed after the tapes 30, 32 are removed from the lead frame panels 18 and 26.

Figure 6:
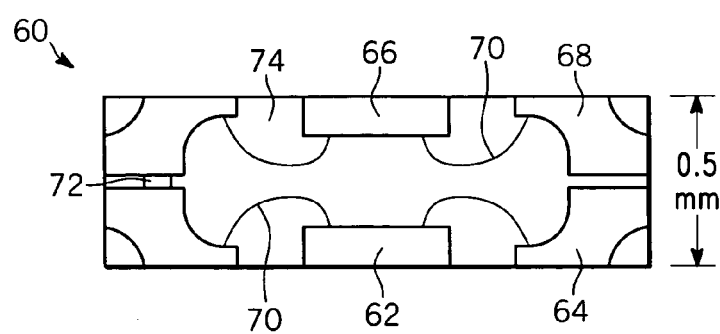
FIG. 6 is an enlarged cross-sectional view of a 3D stackable package in accordance with an embodiment of the present invention.

Referring now to FIG. 6, an enlarged cross-sectional view of a 3D stackable packaged integrated circuit 60 formed in accordance with the method illustrated in FIGS. 1-4 is shown. The packaged integrated circuit 60 includes a first IC die 62 electrically connected to a first lead frame 64, and a second IC die 66 electrically connected to a second lead frame 68. The first and second IC dies 62 and 66 are electrically connected to the respective first and second lead frames 64 and 68 via a plurality of wire bonded wires 70, while the first lead frame 64 is electrically connected to the second lead frame 68 via at least one stud bump 72, which is selectively formed where an electrical connection between the first lead frame 64 and the second lead frame 68 is required. The first and second lead frames 64 and 68, the first and second IC dies 62 and 66, and the stud bump 72 are encapsulated by a mold compound 74 to form the stackable packaged integrated circuit 60. In this particular example, the stackable packaged integrated circuit 60 has an overall thickness or height of about 0.5 millimeter (mm). However, it should be understood that the present invention is not limited by the thickness of the stackable packaged integrated circuit. Rather, the thickness of the stackable packaged integrated circuit is dependent on the thickness of the lead frames and the number of staked ICs. In one exemplary embodiment, the first and second pluralities of lead frames 16 and 24 have a thickness of at least about 8 mils for respective first and second plurality of IC dies 12 and 20 having a thickness of about 4 mils.

Figure 7:
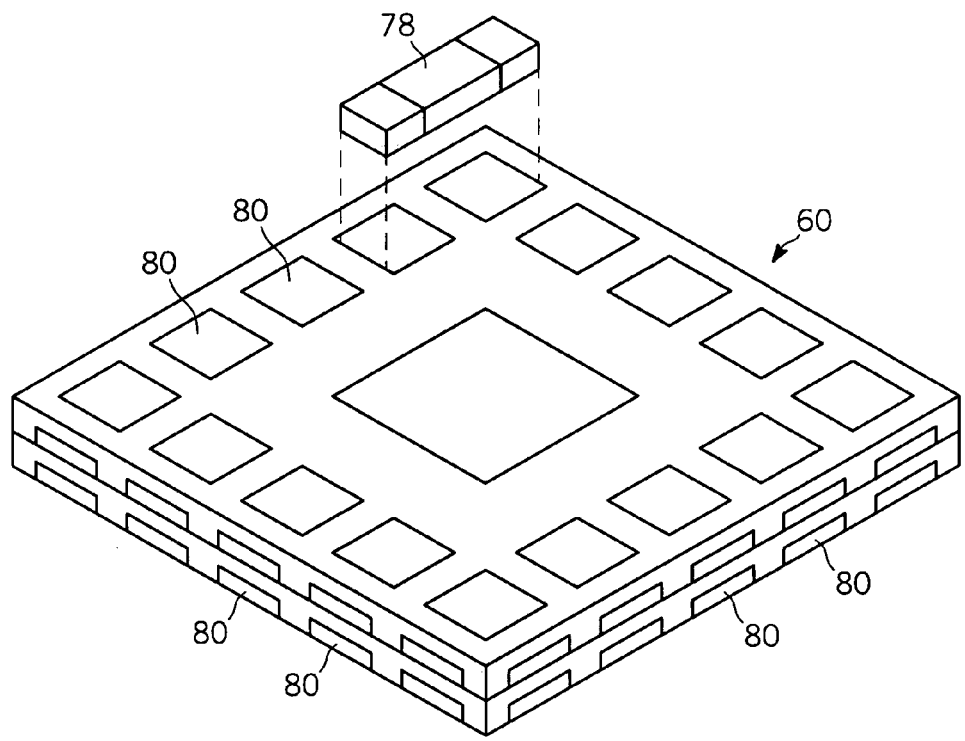
FIG. 7 is a perspective view of the 3D stackable package of FIG. 6 and a passive electronic device in accordance with an embodiment of the present invention.

Referring now to FIG. 7, the electrical connection of a passive electronic device 78 such as, for example, a capacitor or a resistor to the stackable packaged integrated circuit 60 of FIG. 6 is illustrated. As can be seen from FIG. 7, the stackable packaged integrated circuit 60 is a Quad Flat No-Lead type package, provided with a plurality of terminals 80 on each of the six (6) sides of the stackable packaged integrated circuit 60. The provision of the plurality of terminals 80 on each side of the stackable packaged integrated circuit 60 facilitates end-product miniaturization since it permits more efficient use of board space and application space. Additionally, because such a feature permits burn-in and electrical function testing before stacking, faulty stackable packaged integrated circuits can be identified and discarded prior to stacking, thereby improving the accumulated yield of the end-product.

It will be understood by those of skill in the art that the present invention is not limited to the particular example illustrated in FIG. 7. In alternative embodiments, the stackable packaged integrated circuit 60 may be electrically connected to one or more electrical components such as, for example, passive components, sensor modules, semiconductor packages, IC dies, circuits or combinations thereof via one or more terminals 80 on any side of the stackable packaged integrated circuit 60. For example, the terminals 80 on the top surface of the stackable packaged integrated circuit 60 may be electrically connected to a second stackable packaged integrated circuit by external solder joint connections formed between respective terminals on both stackable packaged integrated circuits, while the bottom surface of the stackable packaged integrated circuit 60 is mounted on a PCB.

Figure 8:
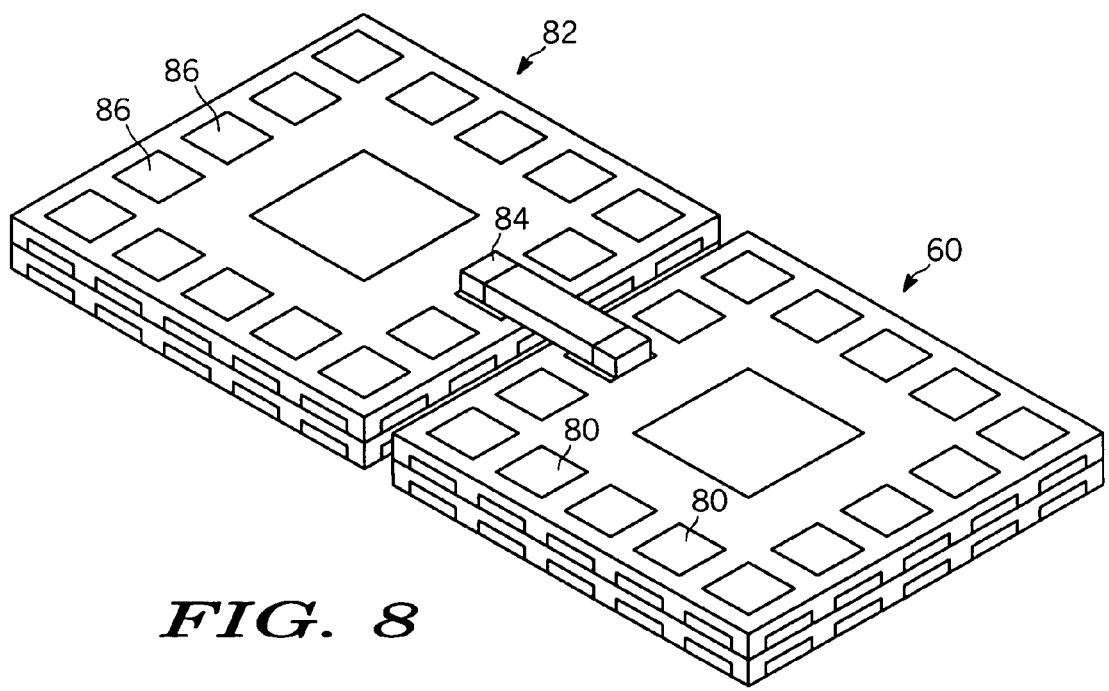
FIG. 8 is a perspective view of two 3D stackable packages placed side-by-side and a passive electronic device in accordance with a further embodiment of the present invention.

Another exemplary embodiment of the present invention is illustrated in FIG. 8. FIG. 8 shows the stackable packaged integrated circuit 60 of FIG. 6 electrically connected to a second stackable packaged integrated circuit 82 with a passive electronic device 84. In this particular example, the stackable packaged integrated circuits 60 and 82 are bridged through respective terminals 80 and 86 on the top surfaces of the stackable packaged integrated circuits 60 and 82.

Referring now to FIG. 9, a first lead frame 100 having a first IC 102 electrically connected thereto is shown. The first IC 102 is electrically connected to the first lead frame 100 via a plurality of flip chip bumps 104. A tape 106 such as, for example, a mold masking tape is taped to a first side 108 of the first lead frame 100. A plurality of stud bumps 110 is formed on the first lead frame 100 for connecting the first lead frame 100 with another lead frame stacked thereon.

Referring now to FIG. 10, the first lead frame 100 of FIG. 9 has stacked thereon a plurality of successive lead frames 112, each electrically connected to respective ones of a plurality of IC dies 114. Each of the lead frames 100 and 112 is electrically connected to an adjacent lead frame by respective ones of a plurality of stud bumps 110 and 116. As can be seen, each of the stud bumps 110 and 116 is selectively formed where an electrical connection between adjacent lead frames is required. The lead frames 100 and 112, the IC dies 102 and 114 and the stud bumps 110 and 116 are encapsulated with an encapsulant material such as, for example, plastic or epoxy to form a stackable packaged integrated circuit 120. Note that the lead frames 100 and 112 are not stacked in facing relationship like the lead frames 64 and 68 in FIG. 6. Thus, the structure shown in FIG. 9 makes it easier to stack an odd number of lead frames one atop another.

Figure 11:
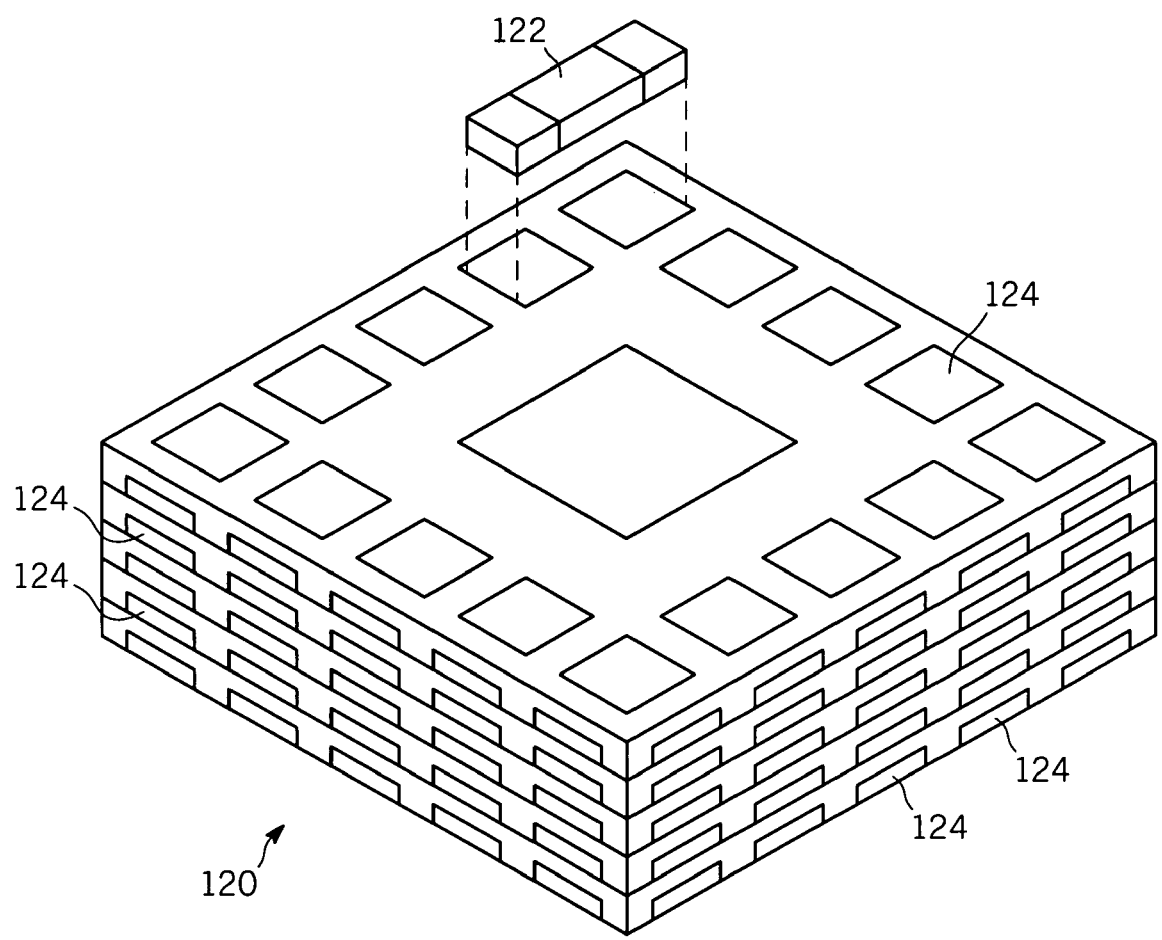
FIG. 11 is a perspective view of the 3D stackable package of FIG. 10 and a passive electronic device in accordance with an embodiment of the present invention.

Referring now to FIG. 11, a perspective view of a plurality of the stackable packaged integrated circuit 120 of FIG. 10, stacked one atop another, and a passive electronic device 122 is shown. In the drawing, five (5) ICs are stacked. The stackable integrated circuit 120 is provided with a plurality of terminals 124 on each of the six (6) sides thereof. The passive electronic device 122 is electrically connected to one of the stackable packaged integrated circuit 120 via the terminals 124. In this embodiment, the passive device 122 is connected to the top of the packaged device 120. However, as will be understood, the passive device 122 could be connected to any side of the package 120 using the terminals on the sides thereof. In alternative embodiments, the stackable packaged integrated circuit 120 may be electrically connected to one or more other electrical components such as, for example, sensor modules, semiconductor packages, or circuits via any of the terminals 124 on any side of the stackable packaged integrated circuit 120.

As is evident from the foregoing discussion, the present invention provides a 3D package and a method of forming the 3D package, which have benefits over existing products and processes. As an example, greater versatility in the design of 3D packages can be achieved with the present invention by selectively forming a stud bump where an electrical connection between selective portions of two adjacent dies is required. Low manufacturing cost is also achievable with the present invention as the stud bumps can be formed in the same pass as the electrical connection between the lead frame and the die, thereby eliminating the need for an additional process step for the formation of the stud bumps. In addition, the present invention facilitates end-product miniaturization and improves the accumulated yield of the end-product through the provision of terminals on each side of a stackable packaged integrated circuit. Further, because the present invention can be implemented using current semiconductor assembly equipment, there is no need for additional capital investment.

Thus it is apparent that there has been provided, in accordance with the invention, a stackable package and a method of forming the stackable package that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention permits the stacking of any number of dies and packages. As addressed earlier, the present invention is not limited by the die facing direction, the type of lead frame used, or the dimensions of the lead frames and the end-product. Nor is the device configuration limited to flip chip and wire bond applications. It should be understood that the present invention may be implemented with multiple functional silicon die in stacked form by mixing flip chip and wire bond technologies in the same electronic device. Furthermore, the present invention is not limited to those types of semiconductor die described or illustrated herein. Therefore, it is intended that this invention encompass all such variations and modifications as fall within the scope of the appended claims.

The invention claimed is:

1. A three dimensional (3D) package, comprising:
    a first integrated circuit (IC) die electrically connected to a first lead frame;
    a second IC die electrically connected to a second lead frame, wherein the first lead frame is stacked on the second lead frame;
    at least one stud bump electrically connecting the first lead frame to the second lead frame, wherein the at least one stud bump is selectively formed where an electrical connection between the first lead frame and the second lead frame is required;
    a mold compound encapsulating the first and second lead frames, the first and second IC dies, and the stud bump; and
    a passive electronic device electrically connected to at least one terminal on one side of the package, wherein the passive electronic device electrically connects the 3D package to a second 3D package.

2. The 3D package of claim 1, wherein the 3D packages are Quad Flat No-Lead type packages.

3. The 3D package of claim 1, further comprising a plurality of terminals on each side of the packages.

4. The 3D package of claim 1, wherein the passive electronic device is one of a capacitor and a resistor.

5. The 3D package of claim 1, further comprising a third IC die electrically connected to a third lead frame and wherein the third lead frame is stacked on the second lead frame and electrically connected thereto with a plurality of stud bumps and the mold compound encapsulates the first, second and third lead frames, the first, second and third IC dies, and the stud bumps.

6. The 3D package of claim 1, wherein the first IC die is electrically connected to the first lead frame via wirebonding.

7. The 3D package of claim 1, wherein the first IC die is electrically connected to the first lead frame as a flip-chip with a plurality of second stud bumps.

* * * * *